United States Patent [19]
Schulz

[11] Patent Number: 6,039,850
[45] Date of Patent: Mar. 21, 2000

[54] SPUTTERING OF LITHIUM

[75] Inventor: Stephen C. Schulz, Princeton, N.J.

[73] Assignee: Minnesota Mining and Manufacturing Company, St. Paul, Minn.

[21] Appl. No.: 08/865,544

[22] Filed: May 29, 1997

Related U.S. Application Data

[63] Continuation-in-part of application No. 08/567,781, Dec. 5, 1995, Pat. No. 5,830,336.

[51] Int. Cl.[7] .................................................. C23C 14/34
[52] U.S. Cl. .................................. 204/192.15; 204/192.33
[58] Field of Search ..................... 204/192.12, 192.15, 204/192.33, 298.08, 298.12, 298.13, 298.19

[56] References Cited

U.S. PATENT DOCUMENTS

| | | | |
|---|---|---|---|
| Re. 34,469 | 12/1993 | Cogen et al. | 359/269 |
| 4,046,659 | 9/1977 | Cormia et al. | 204/192 C |
| 4,709,740 | 12/1987 | Jacoby et al. | 164/5 |
| 4,756,810 | 7/1988 | Lamont et al. | 204/192.3 |
| 4,810,346 | 3/1989 | Wolf et al. | 204/298 |
| 4,824,541 | 4/1989 | Kuo et al. | 429/209 |
| 5,080,471 | 1/1992 | Cogan et al. | 359/275 |
| 5,286,360 | 2/1994 | Szczyrbowski et al. | 204/298.08 |
| 5,288,381 | 2/1994 | Cogan et al. | 204/192.26 |
| 5,336,386 | 8/1994 | Marx et al. | 204/298.12 |
| 5,370,775 | 12/1994 | Parkhe | 204/140 |
| 5,427,669 | 6/1995 | Drummond | 204/298.08 |
| 5,449,445 | 9/1995 | Shinneman et al. | 204/298.12 |
| 5,507,897 | 4/1996 | Campet et al. | |
| 5,830,336 | 11/1998 | Schulz | 204/298.12 |

FOREIGN PATENT DOCUMENTS

WO 89/12844  12/1989  WIPO ............................... G02F 1/17

OTHER PUBLICATIONS

G. Este and W.D. Westwood, "Quasi–direct–current sputtering technique for the deposition of dielectrics enhanced state," *J. Vac. Sci. Technol. A.*, vol. 6, No. 3, May/Jun. 1988, pp. 1845–1848.

J. Harpold and Richard A. Scholl, "How Advanced Energy MDX Products Manage Arcs," paper presented by Advanced Energy Industries, Inc., Fort Collins, Colorado, pp. 3–7.

R.A. Scholl, "Reactive $S_tO_2$ Sputtering Using Advanced Energy's Sparc–le," paper presented by Advanced Energy Industries, Inc., Fort Collins, Colorado.

R.A. Scholl, "Process Improvements for Sputtering Carbon and other Difficult Materials using Combined AC and DC Process Power," *Society of Vacuum Coaters*, paper presented by Advanced Energy Industries, Inc., Fort Collins, Colorado at the 35th Annual Technical Conference Proceedings (1992), pp. 391–394.

S.N. Abromovich, B. Ya. Guzhovskii and G.N. Sleptsov, "Instruments and Experimental Techniques," vol. 26, No. 1, Part 2, Jan.–Feb., 1982, pp. 249–251.

Brochure, TwinMag—The Art of Coating—The New Generation of Sputtering Technology.
Brochure, Target Bonding Services.
Brochure, PlasmArc™ The Clear Choice.
Brochure, Materials for Glass Coating.
Price Quotation from Pure Tech, Inc. dated Feb. 27, 1995.
Price Quotation from Pure Tech, Inc. dated Mar. 27, 1995.

*Primary Examiner*—Nam Nguyen
*Assistant Examiner*—Steven H. Versteeg
*Attorney, Agent, or Firm*—Lerner, David, Littenburg, Krumholz & Mentlik, LLP

[57] ABSTRACT

Lithium is sputtered from a target with a metallic lithium surface using an alternating sputtering potential with a frequency between about 8 and about 120 kHz, preferably about 10–100 kHz or using a DC sputtering potential and a reverse cleaning potential applied intermittently. The process can be used to apply lithium to electrochromic materials such as coatings on window glass.

38 Claims, 5 Drawing Sheets

SPUTTERING OF LITHIUM

CROSS REFERENCE TO RELATED APPLICATIONS

The present application is a continuation-in-part of U.S. patent application Ser. No. 08/567,781 filed Dec. 5, 1995, now U.S. Pat. No. 5,830,336.

This invention was made with government support under the Cooperative Agreement No. 70NANB3H1377 awarded by the National Institute of Standards and Technology of the Department of Commerce. The United States Government has certain rights in the Invention.

FIELD OF THE INVENTION

The present invention relates to processes for sputtering lithium and sputtering targets useful in such processes.

BACKGROUND OF THE INVENTION

In certain industrial processes, it is necessary to add lithium to a substrate. In particular, electrochromic devices, which are adapted to change optical properties in response to changes in an applied electrical potential typically include a plurality of layers incorporating mobile lithium ions. Under the influence of an applied potential, the lithium ions will migrate from one layer to another. The various layers are selected so that the optical properties change depending upon the concentration of lithium in each layer. Materials of this nature are disclosed, for example, in U.S. Pat. No. 5,370,775. These materials can be used in optoelectronic devices such as light modulators, display devices and the like. Electrochromic materials can also be used in selectively controllable window systems for various applications, including windows on buildings and vehicles. Certain production processes for making electrochromic materials require application of lithium to the electrochromic material after the same is formed. As disclosed in the '755 patent, this can be accomplished by exposing the electrochromic materials to an electrolytic process using an electrolyte bearing lithium ions. Although this process is effective, it requires exposure of the substrate bearing the electrochromic layer to a liquid electrolyte. This, in turn, can add to the cost of handling substrates, particularly large substrates such as window glass panes.

It has been proposed heretofore to use sputtering to apply lithium to a substrate such as an electrochromic substrate. In the sputtering, ions are impelled against an exposed surface of a source or "target" formed from the material to be applied, as by imposing an electrical potential between the target and a counterelectrode while maintaining the target in proximity to the substrate. The energetic ions impacting on the target dislodge atoms of the target, commonly referred to as "adatoms", which then deposit on the substrate. Typically, such a process is conducted in a gaseous atmosphere maintained under a very low subatmospheric pressure. The gaseous atmosphere is ionized to form a plasma, a mixture of ionized gas atoms and free electrons. Ions of the gas form the energetic ions which bombard the target. The potential applied between the target and the counterelectrode ordinarily is a fixed (DC) potential, wherein the target is negative with respect to the counterelectrode, where the target is a conductive material. An alternating potential at radio frequencies (RF) typically is used when the target is a dielectric material. Most commonly, the radio frequencies used for such sputtering are at the particular radio frequencies reserved by communications authorities for industrial, scientific and medical uses, the so-called "ISM" frequencies, most typically about 13.56 MHZ or higher.

Targets formed from lithium compounds such as $Li_2CO_3$ can be successfully sputtered to deposit lithium into electrochromic materials. In large scale systems, however, the RF sputtering potential required with a $Li_2CO_3$ target presents process problems such as nonuniformity and requires expensive equipment for generating and handling high power RF. It would be desirable to use a sputtering target having an exposed surface consisting essentially of pure, metallic lithium. Such a metallic lithium sputtering target at least in theory should provide faster more uniform deposition of lithium into the substrate particularly in a relatively large-scale process. As set forth in U.S. Pat. No. 5,288,381, proposals for use of a lithium metal target surface have been advanced. However, there has been no practical process heretofore for sputtering lithium from a target having a metallic lithium surface. In particular, it has been impractical to sputter lithium at a reasonably fast rate from a target having metallic lithium at its exposed surface using DC sputtering potential without damaging the target. It has also been difficult to fabricate lithium sputtering targets heretofore.

There have, accordingly, been substantial unmet needs for further improvements in lithium sputtering processes. There have been further needs for improvements in sputtering targets for use in such processes and in methods of making such targets.

SUMMARY OF THE INVENTION

The present invention addresses these needs.

One aspect of the present invention provides methods of sputtering lithium. Methods according to this aspect of the invention preferably include the steps of maintaining a target having metallic lithium on an exposed surface in a substantially inert gas at subatmospheric pressure together with a counterelectrode and a substrate. The methods further include the step of imposing a periodically reversing electrical potential between the target and the counterelectrode so as to form a plasma adjacent to the target and bombard the exposed surface of the target with ions of the gas to thereby expel lithium from the target to the substrate. The electrical potential desirably has a reversing frequency between about 8 kHz and about 120 kHz. Most preferably, the target includes a layer of metallic lithium disposed on a supporting layer formed from a metallic material such as copper or a copper-based alloy, the lithium being metallurgically bonded to the supporting layer.

Surprisingly, it has been found that processes employing these conditions can allow sputtering of lithium from a lithium surface target to proceed at a substantial rate. By contrast, attempts to sputter lithium from a target with a metallic lithium surface using a non-reversing DC potential can result in rapid destruction of the target when high power levels are applied. Although the present invention is not limited to any theory of the cause of these difficulties, it is believed that destruction of the target with DC potential results from formation of a dielectric, sputter resistant layer on the target surface, or from impurities or defects in the target surface. It is believed that these layers, impurities or defects build up a static charge as DC sputtering continues, and that arcing occurs when the static charge builds to the point of dielectric breakdown of the insulating layer. It is believed that the reversing potential causes dissipation of such charges and therefore prevents arcing. Such dielectric layers theoretically should not form in an inert gaseous atmosphere. However, it is believed that even when substantially pure inert gases are used as the feed stock for forming the atmosphere, and even with scrupulous attention to purging of the reaction chamber, some residual reactive gases such as oxygen and nitrogen persist. Any reactive gases present in the system will react with the lithium to form the insulating films during the process. Further, it is believed that formation of the dielectric layer can begin during exposure to air incident to handling and installation of the target and startup of the sputtering system.

Also, it is believed that a lithium layer metallurgically bonded to the supporting layer provides a path for heat transfer from the lithium layer to the supporting layer having substantially lower thermal resistance than that which can be achieved by abutting contact between the lithium and the supporting layer. Moreover, it is believed that this low thermal resistance will be maintained during the process. As used in this disclosure, the term "metallurgical bond" means an interface between metallic layers at which the metallic layers are substantially bonded to one another and in which the interface consists essentially of metals and intermetallic compounds. It is believed that the metallurgically-bonded interface will not be susceptible to contamination by oxidation or other reactions with atmospheric contaminants during the sputtering process. The methods preferably further include the step of cooling the supporting layer, as by cooling a holder which is in contact with the supporting layer, so that heat is continually conducted from the lithium layer into the supporting layer.

Regardless of the mechanisms of operation, it has been found that methods according to the foregoing aspects of the present invention can be used with surprisingly good results to sputter lithium at substantial rates.

According to a further aspect of the present invention, it has been found that if the target is exposed to a "clearing" potential including a reverse-direction potential (target positive with respect to counterelectrode) during one or more intervals in the sputtering process, sputtering potentials which otherwise would not be expected to work well, such as a pure forward DC sputtering potential or a low frequency AC sputtering potential, can be employed during the remainder of the sputtering process. The clearing potential may include one or more periodic or aperiodic pulses of reverse-direction potential interspersed with forward-direction potential pulses, or may include a conventional, periodic alternating potential. Most preferably, the intervals during which the clearing potential is applied include a first interval before application of the sputtering potential itself. The target should be maintained in the inert atmosphere during the process, from the first interval to after termination of the sputtering potential. The process typically is conducted in an enclosed sputtering chamber and the chamber remains closed during the entire process. Any chamber opening or other exposure of the target to the ambient atmosphere desirably is followed by application of the clearing potential. Although the present invention is not limited by any theory of operation, it is believed that application of the reversing potential at startup removes contaminants, such as lithium oxide leaving a very pure target surface which in turn facilitates sputtering under the sputtering potential.

Stated another way, the preferred processes according to this aspect of the present invention include the step of applying the clearing potential before applying the sputtering potential, and then applying the sputtering potential while maintaining the target in the inert atmosphere. The exposed surface of the target is thus cleaned by sputtering during application of the cleaning potential, and this cleaning may continue during the initial application of the sputtering potential. The ability to start with a lithium metal target having a contaminated surface on the target offers considerable advantages in process design. Thus, it would require considerable care to install a lithium target in a sputtering chamber without somehow contaminating its surface, by even momentary exposure to ambient air. In accordance with this aspect of the invention, reasonable amounts of such contamination can be accommodated without disrupting the sputtering process.

Application of the clearing potential during further intervals, interspersed with periods of the sputtering potential, further facilitates the process. Although the present invention here again is not limited by any theory of operation, it is believed that the clearing potential counteracts the tendency of the lithium metal target to form a dielectric layer on its exposed surface during the sputtering process. Thus, the dielectric layer is believed to form even in the presence of a substantially inert atmosphere as used in an industrial process, due to the inevitable presence of small amounts of contaminant gases such as oxygen and/or nitrogen, and due to the high reactivity of lithium. During the sputtering process, and particularly in a DC sputtering process, the dielectric layer in turn is believed to accumulate a positive charged on the side facing the plasma, which in turn can lead to arcing with the negatively-charged target if the dielectric layer breaks down. It is believed that the clearing potential acts to dissipate the positive charge. This itself suppresses arcing and also facilitates removal of the dielectric layer which further suppresses arcing.

In a particularly preferred process according to this aspect of the invention, the target is exposed to an alternating potential, such as the reversing potential discussed above, during inception of the sputtering process, and DC potentials can be employed during the remainder of the sputtering process. The target is maintained in the inert atmosphere from before termination of the alternating potential to after termination of the DC potential. Stated another way, if the sputtering process is started using the alternating potential, it can continue, at reasonable speed, using a direct potential. The process typically is conducted in an enclosed sputtering chamber and the chamber remains closed during the entire process. Any chamber opening or other exposure of the target to the ambient atmosphere desirably is followed by application of the reversing (AC) potential. Although the present invention is not limited by any theory of operation, it is believed that application of the reversing potential at startup removes contaminants, leaving a very pure target surface which in turn allows DC sputtering under reasonable conditions.

Preferred processes according to these aspects of the invention provide the ability to deposit lithium uniformly over large substrates. Although DC sputtering can be employed as discussed above, it is preferred to apply the a reversing potential, including periods of reverse polarity, throughout the entire sputtering process. Where the substrate includes a lithium-intercalable material as discussed below, it has been found that the reversing potential promotes more rapid transfer of lithium into the substrate. The reasons for this phenomenon are not fully understood. Here again, the present invention is not limited by any theory of operation. However, it is believed that application of the alternating potential to the target and counterelectrode may also result in application of an alternating potential on the substrate, and that this potential may facilitate intercalation of the lithium into the substrate.

The reversing potential may be a symmetrical, sinusoidal alternating potential, or else may have other forms such as an asymmetrical, pulsed potential which the sputtering target is negative with respect to the counterelectrode for the majority of the cycle and positive for the minority of the cycle. The potential more preferably has a reversing frequency between about 10 kHz and about 100 kHz.

The counterelectrode may also include a second lithium-bearing target, in which case the second target is sputtered during one phase of the reversing potential. The substrate may include a lithium-intercalable material at an exposed surface, and lithium expelled from the target desirably intercalates into this lithium-intercalable material. The lithium-intercalable material may be a metal chalcogenide such as an oxide of tungsten or vanadium. The lithium-intercalable material may be an electrochromic material. The process is particularly useful in treatment of relatively large substrates. Most preferably, the substrate is moved in a preselected direction of motion during the potential applying step so that new regions of the substrate are continually exposed to the expelled lithium. The substrate may be a relatively large item such as a sheet or pane of window glass. The substrate may have dimensions transverse to the movement direction of at least about 0.2M and desirably about 0.2M to about 1.5M. Even larger substrates may be employed. The target may incorporate a plurality of target elements, each such target element having an exposed surface portion. These plural target elements may be retained on a single target holder. Most desirably, each target element includes a top layer of metallic lithium defining the exposed surface and a metallic supporting layer, the top layer being metallurgically bonded to the supporting layer.

Further aspects of the present invention provide sputtering target elements. Each such sputtering target element may include a metallic supporting layer as discussed above together with a layer of metallic lithium overlying a front surface of the supporting layer and metallurgically bonded to such supporting layer. The supporting layer desirably is formed from a metal which does not tend to form alloys with lithium rapidly at elevated temperature. Desirably, the metal of the supporting layer is selected from the group consisting of copper, copper-based alloys, nickel-plated copper and stainless steel. Indium desirably is present as a thin coating or interfacial layer between the lithium top layer and the metallic supporting layer, so that the lithium layer is bonded to the supporting layer through the indium interface. Sputtering targets according to this aspect of the present invention can be utilized in processes as aforesaid. It is believed that the intimate metallurgical bond between the lithium top layer and the supporting layer materially enhances heat transfer from the lithium layer to the supporting layer and to the other components of the apparatus. This, in turn, prevents melting of the lithium even at substantial sputtering power levels.

Further aspects of the present invention provide methods of making sputtering targets. Methods according to this aspect of the present invention desirably include the steps of providing a metallic supporting layer, applying molten lithium to a front surface of the supporting layer and cooling the molten lithium to thereby solidify the lithium and form a layer of lithium metallurgically bonded to the supporting layer. Most preferably, the supporting layer includes, at its front surface, a metal selected from the group consisting of copper and copper based alloys. The step of applying molten lithium may include the step of juxtaposing a solid metallic lithium preferably in the form of a sheet of metallic lithium, with the supporting layer so that the solid lithium overlies the top surface and melting the solid lithium.

Most preferably, the molten lithium is brought to an elevated temperature above its melting point, desirably at least about 230° C., and more preferably about 240 to about 280° C., and maintained at such elevated temperature for at least about 20 minutes while in contact with the supporting layer. Still higher temperatures, and longer holding times, can also be used. Such elevated temperature and prolonged wetting time greatly facilitates wetting of the supporting layer by the lithium and formation of a good metallurgical bond between the lithium and the supporting layer. Lower temperatures, typically about 190° C., can be used if the supporting layer is thoroughly cleaned before application of lithium. The step of providing a metallic supporting layer may further include the step of providing a coating of indium on the front surface of the supporting layer. The indium layer also promotes wetting. The step of melting the solid lithium can be performed by applying heat to the supporting layer so that heat is transferred through the supporting layer to the solid lithium. As further discussed below, these preferred arrangements provide for substantially uniform application of lithium, and substantially uniform melting of the lithium, over the extent of the front surface. The supporting layer may have a depression in its top surface and a ridge surrounding the depression. The step of applying molten lithium may be conducted so that the molten lithium completely fills the depression and covers the ridge. This preferred method provides a relatively thick portion of the lithium layer in the depression and yet provides a thin portion of the layer on the ridge. The thin portion can be retained at the outer edge of the ridge by surface tension. This provides complete coverage of the target surface support layer. The sputtering operation desirably is conducted so that lithium is sputtered principally from the thick portion of the layer, as by aligning the thick portion of the layer with the magnetic field of a magnetron-type target holder. Thus, the target has a prolonged service life.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figures 1, 2:
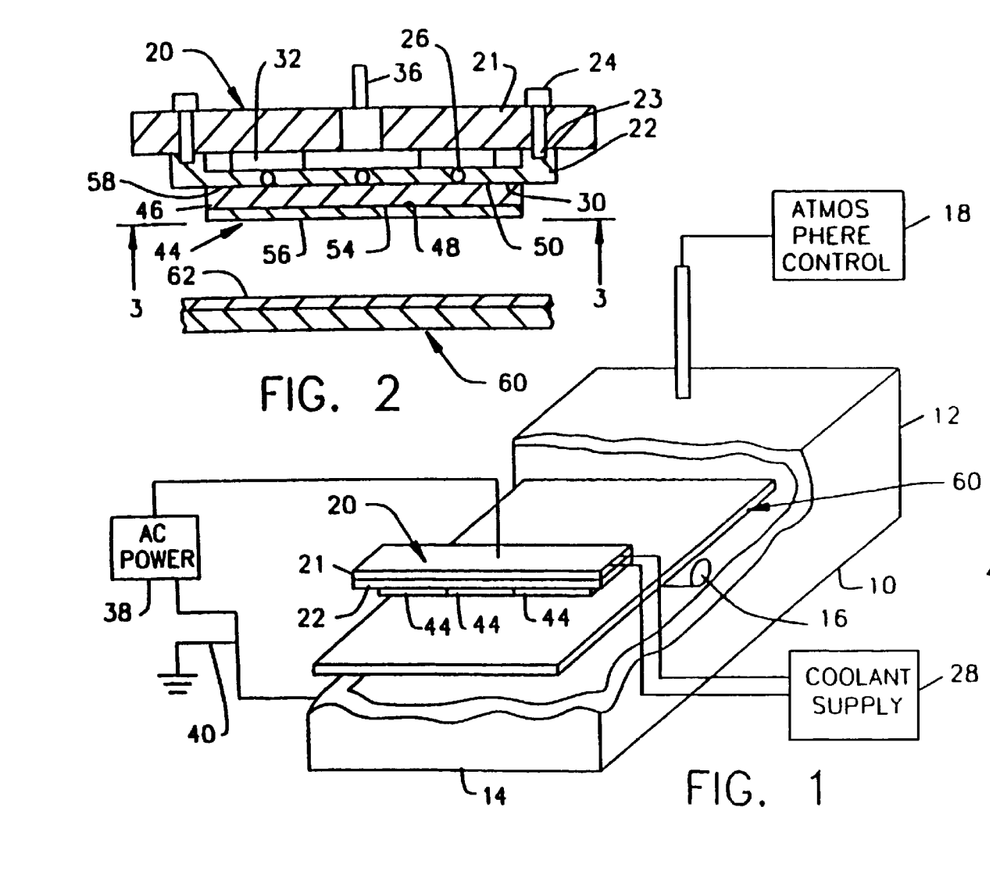
FIG. 1 is a diagrammatic perspective view depicting apparatus in accordance with one embodiment of the invention, with portions removed for clarity of illustration.
FIG. 2 is a diagrammatic, fragmentary sectional view taken along lines 2—2 in FIG. 1.
Figure 3:
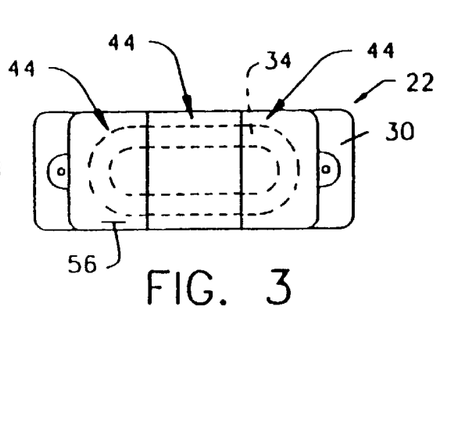
FIG. 3 is a diagrammatic plan view taken along lines 3—3 in FIG. 2.

Apparatus utilized in one process of the present invention includes an electrically grounded metal-walled process chamber 10 having an upstream end 12 and a downstream end 14. The process chamber is equipped with conventional air locks or other devices (not shown) to permit feeding of items to be treated into the chamber through the upstream end 12 and to permit withdrawal of the treated items at the downstream end 14. The chamber is equipped with a substrate conveyor system schematically represented by a feed roller 16 adapted to feed flat sheet-like workpieces from the upstream end to the downstream end. Substrate conveyor 16, and hence the substrates treated by the approaches preferably are electrically isolated from the chamber wall 10 and hence isolated from ground potential. The chamber is also connected to conventional atmospheric control apparatus 18 adapted to fill the space within chamber 10 with an inert gas at a low subatmospheric pressure. The atmospheric control apparatus may incorporate conventional elements such as gas supply cylinders, pressure regulators, vacuum pumps and the like. The apparatus further includes a target element holder 20. The target holder includes a generally rectangular holder plate 21 about 40 cm long and about 13 cm wide. The rectangular holder plate is disposed within chamber 10 and extends transversely to the upstream to downstream direction of the chamber The target holder includes attachment devices, symbolically represented by bolts 24 extending through the holder plate for securing a base plate 22 to the holder plate. Base plate 22 is provided with cooling fluid channels 26, which in turn are connected to a coolant supply unit 28 (FIG. 1). The coolant supply unit is adapted to circulate a liquid through the coolant channels 26, and to maintain such liquid at a controlled temperature, thereby controlling the temperature of the base plate 22. Base plate 22 has a front surface 30 facing away from the wall of the chamber. The target holder 20 includes conventional magnetron equipment 32 adapted to project magnetic flux through the front face 30 of the base plate, and to provide such magnetic flux over a predetermined zone of the front face. This zone 34, indicated by broken lines in FIG. 3, is generally in the shape of an oval loop or "racetrack" and is oriented with its long dimension transverse to the upstream to downstream direction of the chamber. Holder plate 21 is electrically connected to a conductor 36, which in turn is electrically insulated from housing 10. Conductor 36 is connected to one side of an AC power source 38. The opposite side of the power source is connected to ground 40 and to the metallic wall 10 of the chamber.

A sputter target element 44 in accordance with an embodiment of the invention includes a supporting layer 46 having a front surface 48 and a rear surface 50. Supporting layer 46 includes a metal at its front surface 48. This metal should have good thermal conductivity, but should not tend to diffuse rapidly into lithium so as to contaminate lithium remote from the supporting layer with the supporting layer metal when the supporting layer is held in intimate contact with lithium under elevated temperatures. The metal desirably is selected from the group consisting of stainless steel, copper and copper-based alloys. As used in this disclosure, the term "copper-based alloy" means an alloy including more than 50% copper. Substantially pure copper is preferred. Supporting layer 46 desirably is entirely metallic. Preferably, supporting layer 46 is of a uniform composition throughout its thickness, from its from surface 48 to its back surface 50. However, other arrangements may be used. For example, the supporting layer may include metals of other compositions at locations remote from the front surface. Supporting layer 46 has a thin coating 54 of indium on its front surface 48. Coating 54 is substantially continuous over the entire front surface 48. Each target element 44 also includes a front layer 56 of metallic lithium covering the front surface of the supporting layer and hence covering the indium coating 54. As used in this disclosure, the term "metallic lithium" refers to compositions consisting essentially of metals wherein lithium is the predominant metal, accounting for more than about 75% of the metals in the composition and most preferably accounting for about 100% of the composition. Essentially pure lithium is the most preferred form of metallic lithium, although alloys of lithium with other metals may be employed. The front layer 56 is metallurgically bonded to the supporting layer through the indium coating. The indium coating desirably includes only the minimum amount of indium required to form a continuous layer on the surface. Thus, the indium layer desirably is only a few microns thick. This layer is essentially invisible in the structure; it exists as a layer of relatively high indium concentration at the interface between the metallic lithium of the front layer and the metal of the support layer. Preferably, the lithium front layer, prior to use of the target element, is between about 1 mm and about 10 mm thick.

Each sputter target element 44 may be fabricated by first cleaning the supporting layer 46 and etching it in an acid bath, preferably hydrochloric acid. After removal of acid residue as by a distilled water rinse, the supporting layer is transferred into an enclosed working chamber such as a glove box maintained under a dry, substantially inert atmosphere such as dry, essentially oxygen-free argon. To assure cleanliness, the atmosphere in the chamber is purified by melting a mass of scrap lithium within the glove box before cleaning the target. The molten scrap lithium reacts with or "gets" any contaminant gasses from the chamber atmosphere. The molten scrap lithium may be maintained in the working chamber throughout the target fabrication process. The supporting layer is placed on a heater, such as a laboratory hotplate, with the front surface 48 facing upwardly. The front surface should be level, i.e., as close to a true horizontal surface as possible. The heater is operated to supply heat to the rear surface 50 and thus transfer heat through the supporting layer. While the supporting layer is heated, a thin coating of indium is applied by depositing a small amount of indium on the front surface. The indium tends to flow and wet the front surface. This action may be facilitated by mechanically agitating the lithium with stainless steel brushes. The amount of indium utilized need only be sufficient to fully wet the front surface, and form a substantially continuous film over the entire front surface.

After application of the indium, a layer of molten lithium is applied. The molten lithium may be applied by depositing clean, solid lithium on the front surface. Individual pieces of lithium can be applied at spaced apart locations on the front surface. More preferably, however, solid lithium is applied as a sheet of substantially uniform thickness covering substantially the entire front surface of the supporting layer. The temperature of the supporting layer should be maintained as uniform as possible during the heating step. As the temperature of the supporting layer reaches about 180° C. the solid lithium melts and forms a layer of molten lithium on the front surface. During this process, a substantially inert wall or dam, such as a stainless steel sheet can be maintained around the edges of the front surface to confine the molten lithium. Alternatively, the surface tension of the molten lithium can be used to retain the molten lithium layer on the support layer. After melting of the lithium and wetting of the indium-coated surface by the molten lithium, the assembly is allowed to cool under the dry, inert atmosphere. After cooling, the finished target is preserved in an inert atmosphere, as by packaging it in a sealed container under dry inert gas.

In an alternative process, the indium coating is omitted, and the heating of the supporting layer and the molten lithium is continued after the lithium layer has fully melted, so that the molten lithium reaches a temperature substantially above its melting (liquidus) temperature while in contact with the supporting layer. Preferably, the molten lithium, and the supporting layer in contact therewith, are heated to an elevated temperature of at least about 230° C. and more preferably about 240° C. to about 280° C., and maintained at this temperature for at least about 10 minutes and more preferably at least about 20 minutes. Such elevated temperature treatment promotes wetting and formation of a metallurgical bond between the lithium and the supporting layer. The indium layer can be used in with the elevated temperature treatment as well.

The sputtering target is secured to the base plate 22 by a layer of a thermally conductive adhesive, such as a silver filled epoxy layer 58 between the rear surface 50 of the target supporting layer and the front surface 30 of the base plate. The thermally conducting epoxy may be a silver filled epoxy. Preferably, the epoxy is capable of withstanding temperatures up to about 180° C. and desirably can withstand even higher temperatures. Layer 58 should be as thin as possible, but should be substantially continuous over the mating surfaces of the parts to provide the best possible heat transfer.

As best seen in FIG. 3, a plurality of generally rectangular target elements 44 are secured to base plate 22 in end-to-end arrangement, so that the target elements together cover the magnetic field zone 34 of the target holder 20. Thus, the plural target elements form an array of target elements extending transverse to the upstream-to-downstream direction of chamber 10.

In a sputtering process according to one embodiment of the invention, target elements as discussed above are secured on target holder 20. A substrate 60 such as a plate or sheet of glass with a layer 62 of a lithium intercalable electrochromic material is advanced through the chamber in the upstream to downstream direction by conveying device 16. As used in this disclosure, the term "electrochromic material" refers to a material or combination of materials which can be used alone or in combination with other materials to provide an electrochromic effect. Layer 62 faces towards the metallic lithium from layers of the target elements 44. The substrate desirably moves at a rate of about 10–20 cm/min, although any rate of movement can be employed depending on the amount of lithium to be deposited on the substrate. The surface of the substrate to be treated may be at any convenient distance from the exposed surfaces of the target elements as, for example, about 7–8 cm. Every portion of the substrate passes in front of a target element 44. Atmospheric control unit 18 is actuated to maintain an atmosphere of substantially pure, dry argon at a pressure between about 1 and about 100 milliTorr, and most preferably at about 10 milliTorr.

AC power unit 38 is actuated to impose an alternating potential on leads 36, and hence on holder plates 21, base plates 22 and target elements 44. The alternating potential has a frequency of about 120 kHz, more preferably about 10 kHz to about 100 kHz and most preferably about 10 kHz to about 40 kHz. The power source is regulated to apply a substantially constant power level. Preferably, the power level is regulated to between about 0.2 and about 7 watts per $cm^2$ and preferably about 0.2 to about 3.5 watts per $cm^2$ of target element front surface. Another measure of power density in the process is power per unit length of the loop or racetrack region 34. Using this measure, the applied power should be between about 0.15 and about 4 watts per millimeter of loop length and preferably about between 0.15 and about 2.5 watts per millimeter. The applied power converts the argon gas in the vicinity of the target elements to a plasma. The magnetic field provided by magnetic elements 32 enhances formation of the plasma in the vicinity of the target elements. Thus, the gas in the chamber remote from the target elements remains largely unionized.

During each cycle of the applied potential, the electrode assemblies, including base plates 22, go to a negative electrical potential with respect to ground. During this phase of the cycle, positively charged argon ions from the plasma are accelerated towards the target element and impact upon the surface of the lithium layer, thus dislodging lithium atoms. The dislodged lithium atoms pass to the substrate and intercalate into the lithium intercalable layer 62.

If the target elements have been exposed to ambient air or other reactive gases during installation and start up, the voltage developed across AC power source 38 at the start of the process will be relatively high. It is believed that this high voltage is caused by contaminants, such as oxides, nitrides or hydrides formed by reaction of the lithium with the ambient atmosphere. These contaminants can be removed by continued sputtering under the argon atmosphere. Even with a substantial amount of contamination, which may result from a full day's exposure of the target surfaces to ambient air, the sputtering operation can be conducted without appreciable arcing or destruction of the target elements. During this initial sputtering, essentially no lithium is removed from the target. However, upon continued operation in this mode, the contaminants are removed and the voltage drops to its normal, steady state value, whereupon a transfer of lithium from the target elements continues to the normal rate for an uncontaminated target. The ability of the process to withstand contamination of the lithium sputtering target surfaces is particularly important in industrial operation, as it allows reasonable handling and equipment maintenance procedures.

During the process, a substantial portion of the power applied by unit 38 is dissipated as heat is applied to the lithium layers in the target elements. The metallurgical bond at the interface between each lithium layer and the supporting substrate layer 46 allows good conduction of heat from the lithium layer to a supporting layer. Heat is removed from the supporting layer through the silver loaded epoxy layer 58 and base plate 22 to the cooling channels 26 and thus to the coolant circulated by supply unit 28.

Numerous variations and combinations of the features described above can be utilized without departing from the present invention. For example, the number of target elements, and the size of each target element, can be varied as desired to provide sputter coating of essentially any size substrate. Also, it is not essential to move the substrate during the sputtering process if all of the substrate can be accommodated in the vicinity of the sputtering target surface, or if the target itself is moved. Inert gases other than argon can be employed. For example, helium can be used. Helium has an atomic mass close to that of lithium. Similarity of atomic mass promotes efficient sputtering. Substrates other than electrochromic materials can be treated. Also, essentially any suitable mechanical fastening arrangement can be used for securing the base plate 22 to the electrode holder. Thus, other means such as clamps, interlocking parts or pins can be used to secure the base plate and hence the target element to the electrode assembly of the apparatus. Typically, the configuration of these elements is set by the configuration of the electrode holder itself.

A sputtering target element 144 in accordance with a further embodiment of the invention (FIG. 5) includes a supporting layer 146. The supporting layer has a top surface 148 with a depression 147 and a ridge 149 surrounding the depression and defining the edges of the top surface. A top layer 156 of metallic lithium overlies the supporting layer. The top layer covers the entire supporting layer top surface, including depression 147 and ridge 149. The top surface of the top layer is substantially flat or bulged slightly upwardly in the center. The top layer thus includes a relatively thick portion 155 overlying depression 147 and a relatively thin portion overlying ridge 149.

Figure 5:
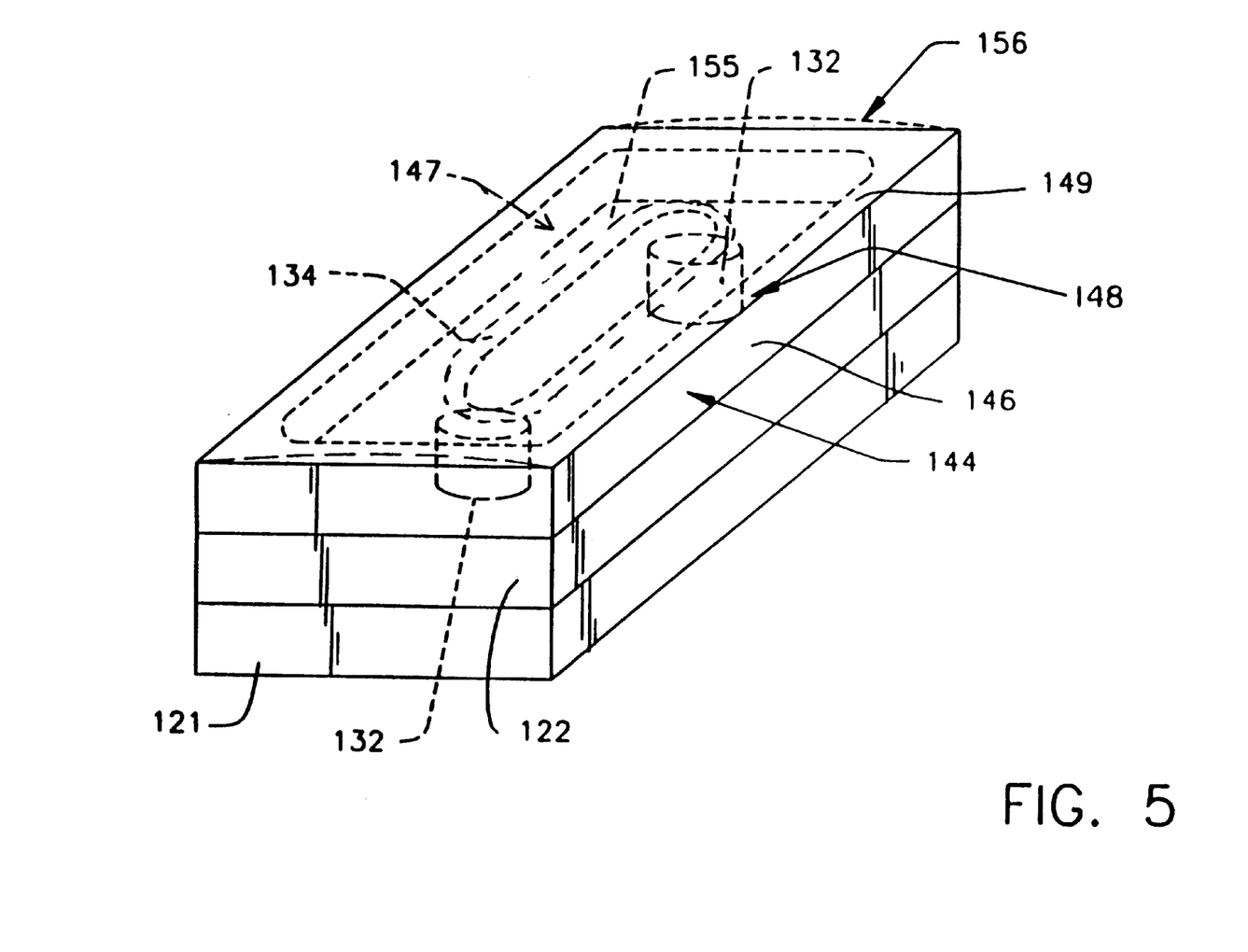
FIG. 5 is a diagrammatic perspective view depicting a component in accordance with a further embodiment of the invention.

A target element in accordance with this embodiment of the invention can be made by applying molten lithium to the top surface of the supporting layer and agitating the lithium using stainless steel brushes so as to spread the lithium over the entire top surface. Wetting of bare copper, by lithium, without an indium layer, can be promoted by such agitation and by heating the assembly well above the melting point of lithium. Thus, where no indium layer is used, the assembly desirably is heated to about 240–280° C., most preferably about 260° C., to promote wetting. The molten lithium is effectively confined by surface tension at the outer edges of ridge 149. Because only a thin layer of lithium is present at the ridge, the pressure exerted by the molten lithium is minimal and is effectively counteracted by surface tension. There is normally no need for external dams or barriers at the edges.

In use, target 144 is fastened to a base plate 122 which in turn is secured to a target holder 121. Holder 121 includes magnetic elements 132 similar to those discussed above, which provide a magnetic field in a magnetic field region 134. Target 144 is secured to holder 121 so that depression 147 and the thick portion 155 of the top layer are aligned with magnetic field region 134. The intensity of the plasma, and hence the rate of sputtering are far higher rate in the magnetic field region than in other areas. Therefore, lithium will be sputtered principally from the thick portion of the top layer. The thick portion allows extended use of the target.

Figures 6, 7:
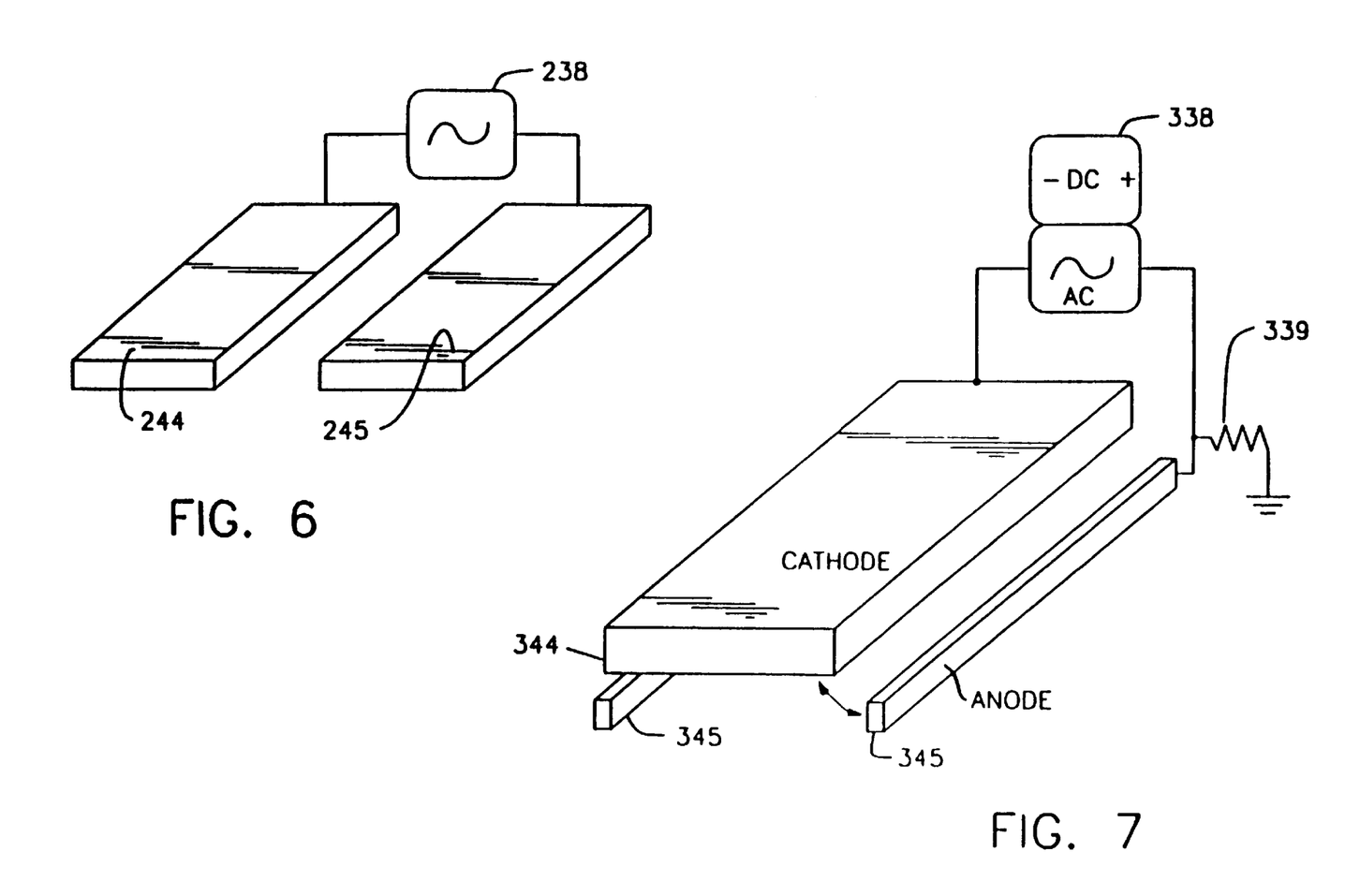
FIGS. 6 and 7 are diagrammatic perspective views depicting portions of apparatus in accordance with further embodiments of the invention.

As shown in FIG. 6, two lithium-bearing targets 244 and 245 can be connected to opposite sides of an AC power supply 238. These targets are disposed within the chamber of sputtering apparatus as described above. During one phase of the AC power cycle, the first target 244 is negative with respect to the second target 245, and hence lithium is sputtered from the first target. During this phase, the second target 245 serves as the counterelectrode. During the next phase, the second target 245 is negative and serves as the source of sputtered lithium, whereas the first target serves as the counterelectrode.

As shown in FIG. 7, counterelectrodes 345 formed separately from the sputtering chamber can be used. These counterelectrodes can be formed from relatively inert, sputter-resistant materials such as stainless steel. The counterelectrodes can be disposed within the chamber adjacent to the lithium-bearing target 344. Location of the counterelectrodes can be adjusted for optimum sputtering speed and uniformity. The counterelectrodes can be connected to one side of a power supply 338 and connected though a high impedance 339, desirably about 500 ohms or more, to ground. The other side of power supply 338 is connected to the target, whereas the chamber wall is grounded.

The preferred embodiments discussed above utilize reversing or alternating potential (AC) throughout the entire sputtering process. In further embodiments of the invention, the reversing potential is applied as a clearing potential during a first interval at the beginning of the process, followed by a sputtering potential in the form of a direct potential (DC) in which the target is negative and the counterelectrode is positive. Desirably, the target remains within the protected environment of the closed sputtering chamber from the beginning of the first interval or AC potential until the end of the DC or sputtering potential. The DC potential may be commenced before termination of the AC potential, upon such termination or after such termination. However, any idle or no-potential time between termination of the clearing or AC potential and commencement of the DC or sputtering potential should be brief, desirably less than a day and more preferably less than an hour. If the chamber is opened and the target is exposed to ambient air for any appreciable time, the AC potential should be repeated. In this arrangement, it is preferred to use AC potentials in the frequency ranges discussed above. However, if the AC potential is used only for startup, and the potential is switched to DC before usable substrates are processed, then process uniformity during the AC portion of the operation will be less critical. In this case, the reversing potential can be a radio frequency potential without impairing process uniformity. This approach is less preferred because of the other drawbacks associated with RF apparatus.

The reversing potential employed as the clearing potential is not limited to a conventional, fixed frequency symmetrical alternating potential such as a conventional sinusoidal AC. Merely by way of example, the clearing potential may include one or more pulses of reverse-direction potential (target positive with respect to the counterelectrode) interspersed with a series of forward-potential pulses during each said interval. The reverse potential applied during each pulse of reverse-direction potential may be of the same magnitude as the forward potential employed during sputtering, or, preferably, of a lesser magnitude. For example, where a forward DC potential of about 200 volts is used for sputtering, the reverse-direction potential used in the clearing intervals may be about 10 to about 200 volts. Also, the reverse-direction pulse may be the same length, longer, or, preferably, shorter, than the forward-potential pulses interspersed therewith. For example, each interval of clearing potential may include reverse-potential pulses between about 1 $\mu$s and about 10 $\mu$s long interspersed with forward-potential pulses between about 10 $\mu$s and about 100 $\mu$s long.

The sputtering potential also is not limited to a direct potential. For example, the sputtering potential may be an alternating potential having a first frequency, whereas the clearing potential may be an alternating potential having a second, higher frequency.

As these and other variations and combinations of the features described above can be utilized, the foregoing description of the preferred embodiments should be taken by way of illustration rather than by way of limitation of the invention as defined by the claims.

Certain aspects of the invention are further illustrated by the following non-limiting examples:

EXAMPLE 1

A generally rectangular target element as described above, with a lithium surface about 38 cm long and 12 cm wide is fabricated by casting lithium on an oxygen-free hard copper supporting layer about 3.2 mm thick. The lithium layer is about 5 mm thick. The supporting layer is secured to the backing plate of an MRC (Materials Research Corporation) 903 sputtering cathode assembly using a silver-loaded epoxy. The epoxy is cured by baking at about 60° C. for three hours and the assembly is then stored overnight at ambient temperature. The assembly is maintained in an argon atmosphere during epoxy curing and during storage until use.

Substrates are fabricated by providing glass sheets with a thin, transparent layer of an electrically conductive oxide and then sputtering tungsten onto the oxide layer of the sheet in an oxidizing atmosphere to form a layer of $WO_3$. Substrates made using a tungsten sputtering current of 8 amperes are referred to as "8 amp $WO_3$," whereas other substrates, prepared using a tungsten sputtering current of 9 amperes are referred to as "9 amp $WO_3$". The 9 amp $WO_3$ samples have a thicker layer of $WO_3$ on the glass. Substrates are coated by passing them back and forth repeatedly under the lithium sputtering target while sputtering lithium from the target. During this operation, the long direction of the sputtering target is maintained transverse to the direction of motion of the substrate. The substrate moves at a speed of about 15 cm/min. A sputtering potential is applied at 40 kHz.

Figure 4:
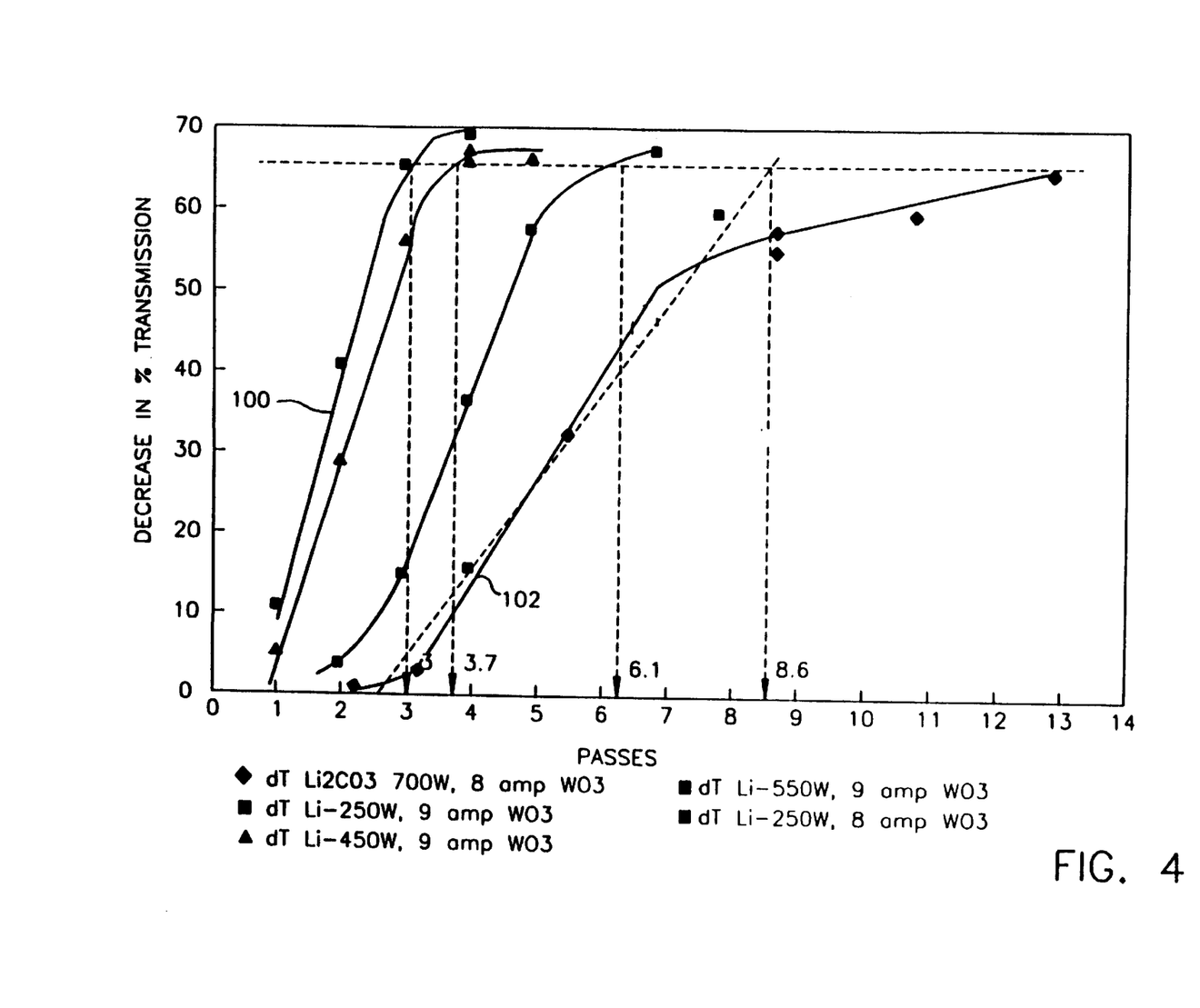
FIG. 4 is a graph of certain experimental results.

The $WO_3$ layer on the substrate becomes darker as lithium intercalates into it. Accordingly, light transmission through the substrate is measured and the change in light transmission is used as a measure of the amount of lithium sputtered onto the substrate. The results are shown in FIG. 4. The process operates stably at power levels up to 550 watts.

For comparison purposes, the same apparatus is used to sputter lithium carbonate ($Li_2CO_3$) using radio frequency power. These results are also indicated in FIG. 4 by the curve indicated as "dTL$Li_2CO_3$ 700 watt . . . . "

The data shown in FIG. 4 indicate that sputtering from a metallic lithium target with 250 watts of sputtering power transfers enough lithium to cause a 65% change in light transmission through an 8 amp $WO_3$ layer in three passes of the substrate under the target (curve 100). By contrast, using 700 watts applied RF power with an $Li_2CO_3$ sputtering target, with a similar 8 amp $WO_3$ layer, requires approximately 13–14 passes to reach the same level of light transmission and hence the same level of lithiation. (curve 102)

EXAMPLE 2

Figure 8:
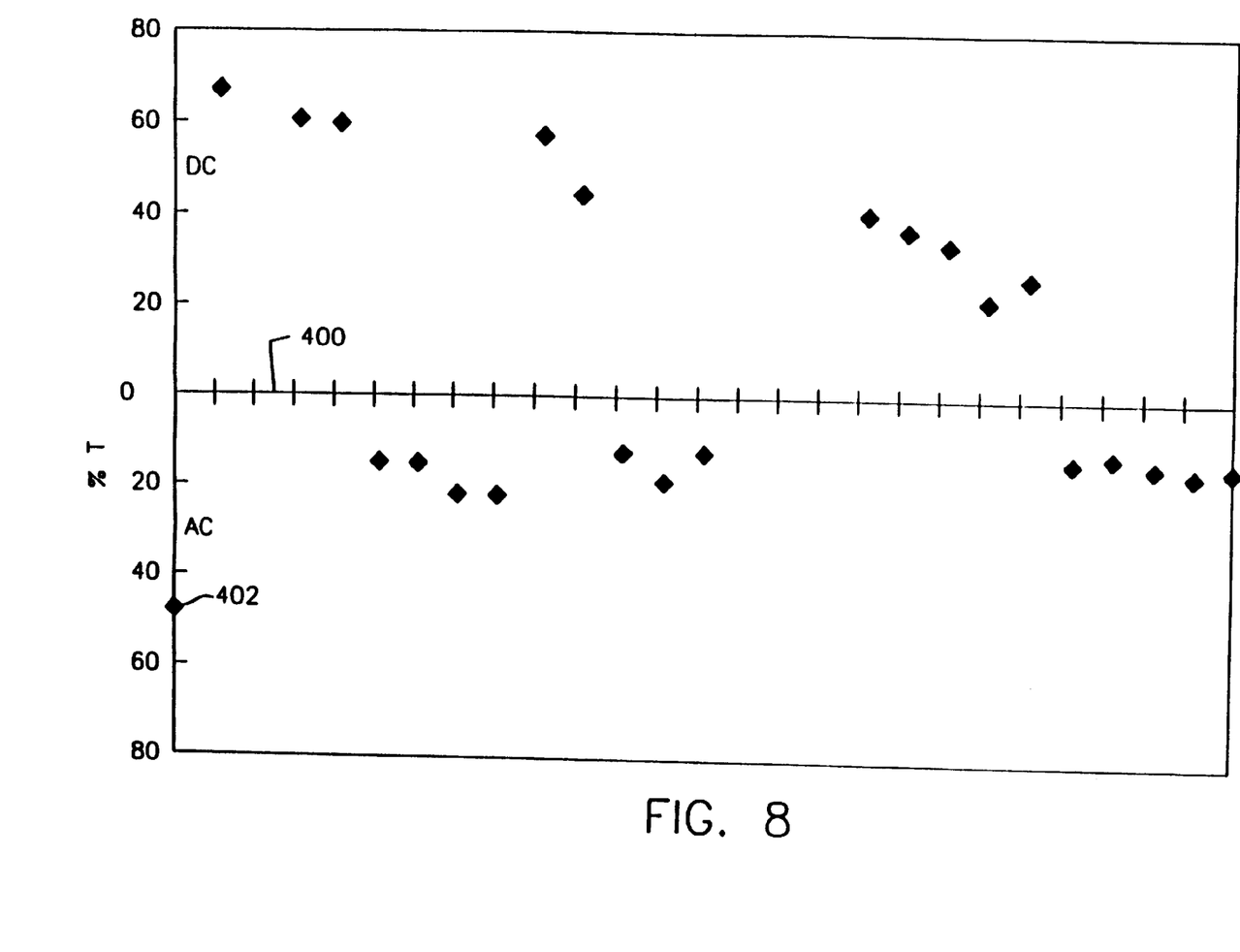
FIG. 8 is a graph depicting further experimental results.

Using procedures similar to those of Example 1, a series of test runs using AC and DC potentials are made with a single target in a single chamber. The target remains in the chamber and the chamber is maintained under the inert atmosphere from the beginning of the first run to the end of the last run. Here again, the lithium transfer to the glass sheets is measured by the percent light transmission (% T, FIG. 8) after exposure; lower values of % T indicate more lithiation. The graph of FIG. 8 shows the results for the various runs in the order in which the runs were made, with later runs to the right as seen in the drawing. Values of % T for runs with AC potential are shown as distance below axis 400 in FIG. 8, whereas values for runs with DC potential are shown above the axis. In both cases, points closer to axis 400 represent greater degrees of lithiation. The first run 402 after the chamber is closed is made using AC potential. Subsequent runs demonstrate that although a reasonable degree of lithiation is achieved with the DC runs, the AC runs yield a higher degree of lithiation.

I claim:

1. A method of sputtering lithium comprising the steps of:
(a) providing a target including a top layer of metallic lithium defining an exposed surface and a metallic supporting layer, a counterelectrode and a substrate;
(b) maintaining the target, counterelectrode and substrate in a substantially inert atmosphere at subatmospheric pressure; and, while maintaining the target in said substantially inert atmosphere:
(c) applying a sputtering potential between said counterelectrode and said target, said sputtering potential including being either an alternating potential or a direct potential in a forward direction so that said target is negative with respect to said counterelectrode, said step of applying a sputtering potential being performed so as to maintain a plasma adjacent to said target and sputter metallic lithium from said target under the influence of said sputtering potential; and
(d) during one or more intervals prior to termination of said first potential, applying a clearing potential between said counterelectrode and said target, said clearing potential being different from said sputtering potential and including a reverse potential in a reverse direction opposite to said forward direction.

2. A method of sputtering lithium comprising the steps of:
(a) providing a target including a top layer of metallic lithium defining an exposed surface and a metallic supporting layer, a counterelectrode and a substrate;
(b) maintaining the target, counterelectrode and substrate in a substantially inert atmosphere at subatmospheric pressure; and, while maintaining the target in said substantially inert atmosphere:
(c) applying a sputtering potential between said counterelectrode and said target, said sputtering potential including being either an alternating potential or a direct potential in a forward direction so that said target is negative with respect to said counterelectrode, said step of applying a sputtering potential being performed so as to maintain a plasma adjacent to said target and sputter metallic lithium from said target under the influence of said sputtering potential; and
(d) cleaning said exposed surface by applying a clearing potential between said counterelectrode and said target during a first interval before application of said sputtering potential, said clearing potential being different from said sputtering potential and including a reverse potential in a reverse direction opposite to said forward direction.

3. A method as claimed in claim 2 further comprising the step of applying said clearing potential during at least one additional interval after commencement of said step of applying said sputtering potential.

4. A method as claimed in claim 1 or claim 2 or claim 3 wherein said step of applying said clearing potential includes the step of applying a regular alternating potential having a substantially constant frequency.

5. A method as claimed in claim 4 wherein said sputtering potential is a periodic alternating potential having a first frequency and said clearing potential is a periodic alternating potential having a second frequency higher than said first frequency.

6. A method as claimed in claim 4 wherein said sputtering potential is a direct potential.

7. A method as claimed in claim 1 or claim 2 or claim 3 wherein said step of applying said clearing potential includes the step of applying a reverse potential in said reverse direction in one or more pulses during each said interval.

8. A method as claimed in claim 7 wherein said pulses are applied as a series of reverse-potential pulses interspersed with a series of forward-potential pulses during each said interval.

9. A method as claimed in claim 8 wherein each said reverse-potential pulse is between about 1 $\mu$s and about 10 $\mu$s long and wherein each said forward-potential pulse is between about 10 $\mu$s and about 100 $\mu$s long.

10. A method as claimed in claim 8 wherein said sputtering potential is a direct potential having a first magnitude and said reverse potential has a magnitude smaller than said first magnitude.

11. A method as claimed in claim 2 or claim 3 wherein said target has one or more lithium compounds on said exposed surface prior to said first interval and wherein said lithium compounds are at least partially removed from said exposed surface during said first interval.

12. A method as claimed in claim 11 wherein said step of applying said sputtering potential is commenced less than about 1 hour after termination of the said first interval.

13. A method as claimed in claim 1 or claim 2 or claim 3 wherein said step of maintaining said target, counterelectrode and substrate in said inert atmosphere includes the step of maintaining said target, counterelectrode and substrate in an enclosed chamber and maintaining said chamber substantially closed from before termination of the first said interval until after termination of said sputtering potential.

14. A method as claimed in claim 1 or claim 2 or claim 3 further comprising the step of cooling the layer of metallic lithium by cooling the metallic supporting layer so that heat is conducted from the lithium layer to the supporting layer.

15. A method as claimed in claim 14 wherein said layer of metallic lithium is metallurgically bonded to said supporting layer.

16. A method of sputtering lithium comprising the steps of maintaining a first target including a top layer of metallic lithium defining an exposed surface and a metallic supporting layer, said top layer being metallurgically bonded to said supporting layer, a counterelectrode and a substrate in a substantially inert gas at subatmospheric pressure and imposing a potential between said target and said counterelectrode so as to form a plasma adjacent to said target and bombard said exposed surface with ions of said gas to thereby expel lithium from said target to said substrate, said step of imposing said potential including the step of applying an alternating potential having a reversing frequency between about 8 kHz and about 120 kHz.

17. A method as claimed in claim 16 wherein said step of imposing said potential includes the step of applying a direct potential, said direct potential continuing after termination of said alternating potential, said target being maintained continuously in said inert atmosphere from the inception of said alternating potential to termination of said direct potential.

18. A method as claimed in claim 16 wherein said alternating potential is applied throughout the entirety of said potential-imposing step.

19. A method as claimed in claim 18 wherein said counterelectrode includes a second target having metallic lithium on an exposed surface, whereby lithium will be sputtered from said second target as well as said first target during application of said alternating potential.

20. A method as claimed in claim 16 wherein said alternating potential has a reversing frequency between about 10 kHz and about 100 kHz.

21. A method as claimed in claim 16 wherein said alternating potential has a substantially symmetrical waveform.

22. A method as claimed in claim 16 wherein said alternating potential has an asymmetrical waveform so that said target is negative with respect to said counterelectrode for the majority of each cycle of said waveform.

23. A method as claimed in claim 16 wherein said gas consists essentially of argon or a mixture of argon and helium.

24. A method as claimed in claim 16 further comprising the step of cooling the layer of metallic lithium by cooling the metallic supporting layer so that heat is conducted from the lithium layer to the supporting layer.

25. A method as claimed in claim 1 or claim 2 or claim 16 wherein said substrate includes a lithium-intercalable material at an exposed surface, and wherein said lithium expelled from said target intercalates into said lithium-intercalable material.

26. A method as claimed in claim 25 wherein said lithium-intercalable material is a metal chalcogenide.

27. A method as claimed in claim 26 wherein said metal chalcogenide consists essentially of $WO_3$.

28. A method as claimed in claim 25 wherein said lithium-intercalable material is an electrochromic material.

29. A method as claimed in claim 1 or claim 2 or claim 16 wherein said step of imposing a potential is conducted so as to deliver power at a rate of between about 0.2 and about 7 W per $cm^2$ of said exposed surface.

30. A method of sputtering lithium comprising the steps of:
(a) providing a target including a top layer of metallic lithium defining an exposed surface and a metallic supporting layer, a counterelectrode and a substrate;
(b) maintaining the target, counterelectrode and substrate in a substantially inert atmosphere at subatmospheric pressure; and, while maintaining the target in said substantially inert atmosphere:
(c) applying a sputtering potential between said counterelectrode and said target, said sputtering potential including being either an alternating potential or a direct potential in a forward direction so that said target is negative with respect to said counterelectrode, said step of applying a sputtering potential being performed so as to maintain a plasma adjacent to said target and sputter metallic lithium from said target under the influence of said sputtering potential; and
(d) during one or more intervals prior to termination of said first potential, applying a clearing potential between said counterelectrode and said target, said clearing potential being different from said sputtering potential and including a reverse potential in a reverse direction opposite to said forward direction,
the method further comprising the step of continuously moving said substrate in a direction of motion during said step of imposing a potential to thereby expose new regions of the substrate to said expelled lithium.

31. A method as claimed in claim 30 wherein said substrate and said exposed surface of said target have dimensions transverse to said movement direction of at least about 0.2 m.

32. A method as claimed in claim 31 wherein said target includes a plurality of target elements each having an exposed surface, the surfaces of said one or more target elements cooperatively constituting the exposed surface of said target.

33. A method of sputtering lithium comprising the steps of:
(a) providing a target including a top layer of metallic lithium defining an exposed surface and a metallic supporting layer, a counterelectrode and a substrate;
(b) maintaining the target, counterelectrode and substrate in a substantially inert atmosphere at subatmospheric pressure; and, while maintaining the target in said substantially inert atmosphere:
(c) applying a sputtering potential between said counterelectrode and said target, said sputtering potential including being either an alternating potential or a direct potential in a forward direction so that said target is negative with respect to said counterelectrode, said step of applying a sputtering potential being performed so as to maintain a plasma adjacent to said target and sputter metallic lithium from said target under the influence of said sputtering potential; and (d) cleaning said exposed surface by applying a clearing potential between said counterelectrode and said target during a first interval before application of said sputtering potential, said clearing potential being different from said sputtering potential and including a reverse potential in a reverse direction opposite to said forward direction, the method further comprising the step of continuously moving said substrate in a direction of motion during said step of imposing a potential to thereby expose new regions of the substrate to said expelled lithium.

34. A method as claimed in claim 33 wherein said substrate and said exposed surface of said target have dimensions transverse to said movement direction of at least about 0.2 m.

35. A method as claimed in claim 34 wherein said target includes a plurality of target elements each having an exposed surface, the surfaces of said one or more target elements cooperatively constituting the exposed surface of said target.

36. A method of sputtering lithium comprising the steps of maintaining a first target including a top layer of metallic lithium defining an exposed surface and a metallic supporting layer, said top layer being metallurgically bonded to said supporting layer, a counterelectrode and a substrate in a substantially inert gas at subatmospheric pressure and imposing a potential between said target and said counterelectrode so as to form a plasma adjacent to said target and bombard said exposed surface with ions of said gas to thereby expel lithium from said target to said substrate, said step of imposing said potential including the step of applying an alternating potential having a reversing frequency between about 8 kHz and about 120 kHz, the method further comprising the step of continuously moving said substrate in a direction of motion during said step of imposing a potential to thereby expose new regions of the substrate to said expelled lithium.

37. A method as claimed in claim 36 wherein said substrate and said exposed surface of said target have dimensions transverse to said movement direction of at least about 0.2 m.

38. A method as claimed in claim 37 wherein said target includes a plurality of target elements each having an exposed surface, the surfaces of said one or more target elements cooperatively constituting the exposed surface of said target.

* * * * *

UNITED STATES PATENT AND TRADEMARK OFFICE
CERTIFICATE OF CORRECTION

PATENT NO. : 6,039,850
DATED : March 21, 2000
INVENTOR(S) : Stephen C. Schulz

It is certified that error appears in the above-indentified patent and that said Letters Patent is hereby corrected as shown below:

Column 1, line 40, after "using" delete "an".
Column 3, line 59, after "oxide" insert --,--.
Column 4, line 53, after "the" delete "a".
Column 7, line 19, after "chamber" insert --.--.
Column 11, line 34, after "higher" delete "rate".

Signed and Sealed this

Twentieth Day of March, 2001

Attest:

NICHOLAS P. GODICI

Attesting Officer        Acting Director of the United States Patent and Trademark Office